United States Patent
Fujikata et al.

[11] Patent Number: 6,001,430
[45] Date of Patent: Dec. 14, 1999

[54] MAGNETORESISTANCE EFFECT FILM AND PRODUCTION PROCESS THEREOF

[75] Inventors: Jun-ichi Fujikata; Kazuhiko Hayashi; Hidefumi Yamamoto; Kunihiko Ishihara, all of Tokyo, Japan

[73] Assignee: NEC Corporation, Tokyo, Japan

[21] Appl. No.: 09/166,896

[22] Filed: Oct. 6, 1998

Related U.S. Application Data

[62] Division of application No. 08/521,850, Aug. 31, 1995, Pat. No. 5,872,502.

[30] Foreign Application Priority Data

Sep. 8, 1994 [JP] Japan .................................. 6-214837
Nov. 2, 1994 [JP] Japan .................................. 6-269524

[51] Int. Cl.$^6$ .................................................. H01F 1/00
[52] U.S. Cl. ......................... 427/548; 427/129; 427/130; 427/131; 427/314; 427/598
[58] Field of Search .................. 427/548, 129, 427/130, 131, 132, 598, 314

[56] References Cited

U.S. PATENT DOCUMENTS

| | | |
|---|---|---|
| 4,103,315 | 7/1978 | Hempstead et al. . |
| 4,663,685 | 5/1987 | Tsang . |
| 4,814,921 | 3/1989 | Hamakawa et al. . |
| 5,134,533 | 7/1992 | Friedrich et al. . |
| 5,304,975 | 4/1994 | Saito et al. . |
| 5,365,212 | 11/1994 | Saito et al. . |
| 5,462,795 | 10/1995 | Shinjo et al. . |
| 5,475,550 | 12/1995 | George . |
| 5,508,866 | 4/1996 | Gill et al. . |
| 5,549,978 | 8/1996 | Iwasaki et al. . |
| 5,563,752 | 10/1996 | Komuro et al. . |

FOREIGN PATENT DOCUMENTS

| | | |
|---|---|---|
| 0594243 | 4/1994 | European Pat. Off. . |
| 4-358310 | 12/1992 | Japan . |

OTHER PUBLICATIONS

M. Carey, et al., "Co–NiO superlattices: Interlayer interactions and exchange anisotropy with $Ni_{81}Fe_{19}$ (invited)," *Journal of Applied Physics*, 73 (1993) May 15, No. 10, pp. 6892–6897.

M. Carey, et al., "Exchange anisotropy in coupled films of $Ni_{81}Fe_{19}$ with Nio and $CO_xNi_{1-x}O$," *Applied Physics Letters*, vol. 60, No. 24, Jun. 15, 1992, pp. 3060–3062.

M. Carey, et al., "Exchange anisotropy in $Ni_{80}Fe_{20}/Co_xNi_{1-x}O$ coupled films (abstract)," *Journal of Applied Physics*, 69(1991) Apr. 15, No. 8, p. 4547.

B. Dieny, et al. "Giant magnetoresistance in soft ferromagnetic multilayers," *The American Physical Society*, vol. 43, No. 1 (Jan. 1, 1991), pp. 1297–1300.

*Primary Examiner*—Bernard Pianalto
*Attorney, Agent, or Firm*—Sughrue, Mion, Zinn, Macpeak & Seas, PLLC

[57] ABSTRACT

A magnetoresistance effect film is disclosed. This magnetoresistance effect film comprises a substrate, at least two ferromagnetic thin films stacked one over the other on the substrate with a non-magnetic thin film interposed therebetween, and an antiferromagnetic thin film arranged adjacent to one of the ferromagnetic thin films. The antiferromagnetic thin film is a superlattice formed of at least two oxide antiferromagnetic materials selected from NiO, $Ni_xCo_{1-x}O$ ($0.1 \leq x \leq 0.9$) and $C_oO$. A biasing magnetic field Hr applied to the one ferromagnetic thin film located adjacent the antiferromagnetic thin film is greater than coercive magnetic force $Hc_2$ of the other ferromagnetic thin film.

2 Claims, 6 Drawing Sheets

RECORDING MEDIUM

MAGNETORESISTANCE EFFECT FILM AND PRODUCTION PROCESS THEREOF

This is a divisional of application Ser. No. 08/521,850 filed Aug. 31, 1995, U.S. Pat. No. 5,872,502 the disclosure of which is incorporated herein by reference.

BACKGROUND OF THE INVENTION

1. Field of the Invention

This invention relates to a magnetoresistance effect film useful in a magnetoresistance effect device employed, for example, to read as signal information or the like recorded on a magnetic recording medium or the like, and more specifically to a magnetoresistance effect film which shows a large rate of change in resistance in a small external magnetic fields.

2. Description of the Related Art

In recent years, high sensitization of magnetic sensors and high densification in magnetic recording are under way. Keeping step with this, active developments have been conducted with respect to magnetoresistance effect magnetic sensors (hereinafter called "MR sensors") and magnetoresistance effect magnetic heads (hereinafter called "MR heads"). MR sensors and MR heads each detect a change in resistance at a read sensor made of a magnetic material to read an external magnetic field signal. In these MR sensors and MR heads, their reproduction outputs do not depend on their relative speeds with recording media, leading to the merit that the MR sensors have high sensitivity and the MR heads provides high outputs in high-density magnetic recording.

Proposed recently is a magnetoresistance effect film having at least two ferromagnetic thin films stacked one over the other with a non-magnetic thin film interposed therebetween and an antiferromagnetic thin film arranged adjacent to one of the ferromagnetic thin films so that said one ferromagnetic thin film is provided with antimagnetic force. When an external magnetic field is applied to this magnetoresistance effect thin film, the one ferromagnetic thin film and the other ferromagnetic thin film are magnetized in different directions under the external magnetic field, whereby a change takes place in resistance (Phys. Rev. B, 43, 1297, 1991; Japanese Patent Laid-Open No. 358310/1992).

Although the magnetoresistance effect device of the preceding application is operable in small external magnetic fields, each signal magnetic field must be applied in the direction of an easy magnetization axis when it is used as a practical sensor or magnetic head. It is therefore accompanied by the problems that, when employed as a sensor, no change in resistance is exhibited around the zero magnetic field and non-linearity such as when a Barkhausen jump appears.

Further, there is a ferromagnetic interaction between the ferromagnetic thin films which are located adjacent to each other with the non-magnetic thin film interposed therebetween, resulting in the problem that a linear range in an MR curve is shifted from the zero magnetic field.

Moreover, it is necessary to use FeMn, a material having poor corrosion resistance, as the antiferromagnetic thin film. This involves the problem that upon practice, an additional measure is needed such as incorporation of an additive or application of a protective film.

When an oxide antiferromagnetic material excellent in corrosion resistance is formed into a film at a room temperature to provide the antiferromagnetic thin film, on the other hand, the biasing magnetic field is small so that the coercive force of the adjacent ferromagnetic thin film becomes large. This has led to the problem that a magnetization anti-parallel state can hardly be obtained between ferromagnetic thin films.

Because of the construction that a change in resistance is obtained basically by using a change in the length of mean free path of conduction electrons across the three layers of the magnetic/non-magnetic/magnetic films, the above-described conventional magnetoresistance effect films are accompanied by the problem that they show smaller rates of change in resistance compared with magnetoresistance effect films having multilayer structures and called the "coupling type".

SUMMARY OF THE INVENTION

An object of the present invention is to provide a magnetoresistance effect film which linearly shows a large change in resistance around the zero magnetic field, is operable at high temperatures and moreover, is excellent in corrosion resistance.

To achieve the above object, the present invention provides a magnetoresistance effect film comprising a substrate, at least two ferromagnetic thin films stacked one over the other on said substrate with a non-magnetic thin film interposed therebetween, and an antiferromagnetic thin film arranged adjacent to one of said ferromagnetic thin films, said antiferromagnetic thin film being a superlattice formed of at least two oxide antiferromagnetic materials selected from NiO, $Ni_xCo_{1-x}O$ ($0.1 \leq x \leq 0.9$) and $C_oO$, and a biasing magnetic field Hr applied to said one ferromagnetic thin film located adjacent said antiferromagnetic thin film being greater than coercive magnetic force $Hc_2$ of the other ferromagnetic thin film.

The present invention also provides a process for producing a magnetoresistance effect film by forming, on a substrate, at least two ferromagnetic thin films stacked one over with a non-magnetic thin film interposed therebetween, and an antiferromagnetic thin film arranged adjacent to one of said ferromagnetic thin films, said antiferromagnetic thin film being a superlattice formed of at least two oxide antiferromagnetic materials selected from NiO, $Ni_xCo_{1-x}O$ ($0.1 \leq x \leq 0.9$) and $C_oO$, and a biasing magnetic field Hr applied to said one ferromagnetic thin film located adjacent said antiferromagnetic thin film being greater than coercive magnetic force $Hc_2$ of the other ferromagnetic thin film, wherein a magnetic field applied during formation of said one ferromagnetic thin film and a magnetic field applied during formation of said other ferromagnetic thin film are rotated over 90 degrees from each other so that easy magnetization axes of said ferromagnetic thin films are perpendicular to each other.

DETAILED DESCRIPTION OF THE INVENTION

Figure 3:
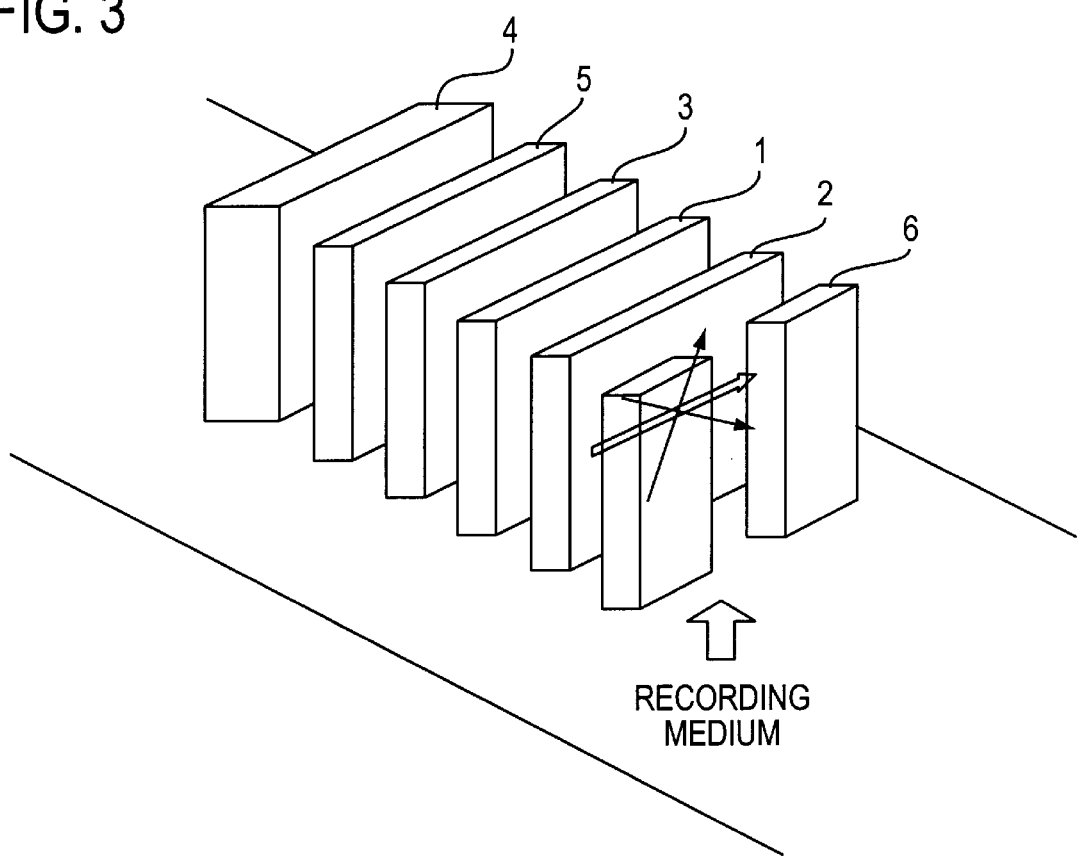
FIG. 3 is an exploded perspective view illustrating the construction of an illustrative magnetoresistance sensor according to the present invention.

FIG. 3 illustrates the construction of the illustrative magnetoresistance sensor according to the present invention. Ferromagnetic thin films 2,3 are arranged with their easy magnetization axes extending at a right angle relative to each other and with a non-magnetic thin film 1 interposed therebetween. At this stage, one of the ferromagnetic thin films, that is, the ferromagnetic thin film 3 has been applied with unidirectional anisotropy by the adjacent antiferromagnetic thin film 5. The magnetic field of each signal from a magnetic recording medium is set so that the magnetic field becomes perpendicular to the direction of the easy magnetization axis of the other ferromagnetic thin film 2. In the direction of the easy magnetization axis of the other ferromagnetic thin film 2, an antiferromagnetic thin film or permanent magnetic thin film 6 may be additionally arranged adjacent the other ferromagnetic thin film 2 as shown in FIG. 3, whereby the direction of magnetization is directed solely in the direction of the easy magnetization axis. Since the direction of magnetization of the ferromagnetic thin film 2 responds to each signal magnetic field and rotates, the resistance is changed so that the magnetic field is detected.

For the magnetoresistance effect film according to the present invention, it is essential that the antiferromagnetic thin film is formed adjacent the one ferromagnetic thin film to apply exchange biasing force to the one ferromagnetic thin film, because according to the principle of the present invention, a maximum resistance is exhibited when the directions of magnetization of the adjacent ferromagnetic thin films become opposite to each other. Described specifically, when an external magnetic field is between the anisotropic magnetic field of the ferromagnetic thin film and the antimagnetic force of the one ferromagnetic thin film ($Hk_2 \leq H \leq Hr$) as illustrated in FIG. 1, the direction of magnetization of the adjacent ferromagnetic thin films become opposite to each other, resulting in an increase in resistance in the present invention.

A description will now be made of a relationship among an external magnetic field, coercive force and the direction of magnetization.

Figure 1:
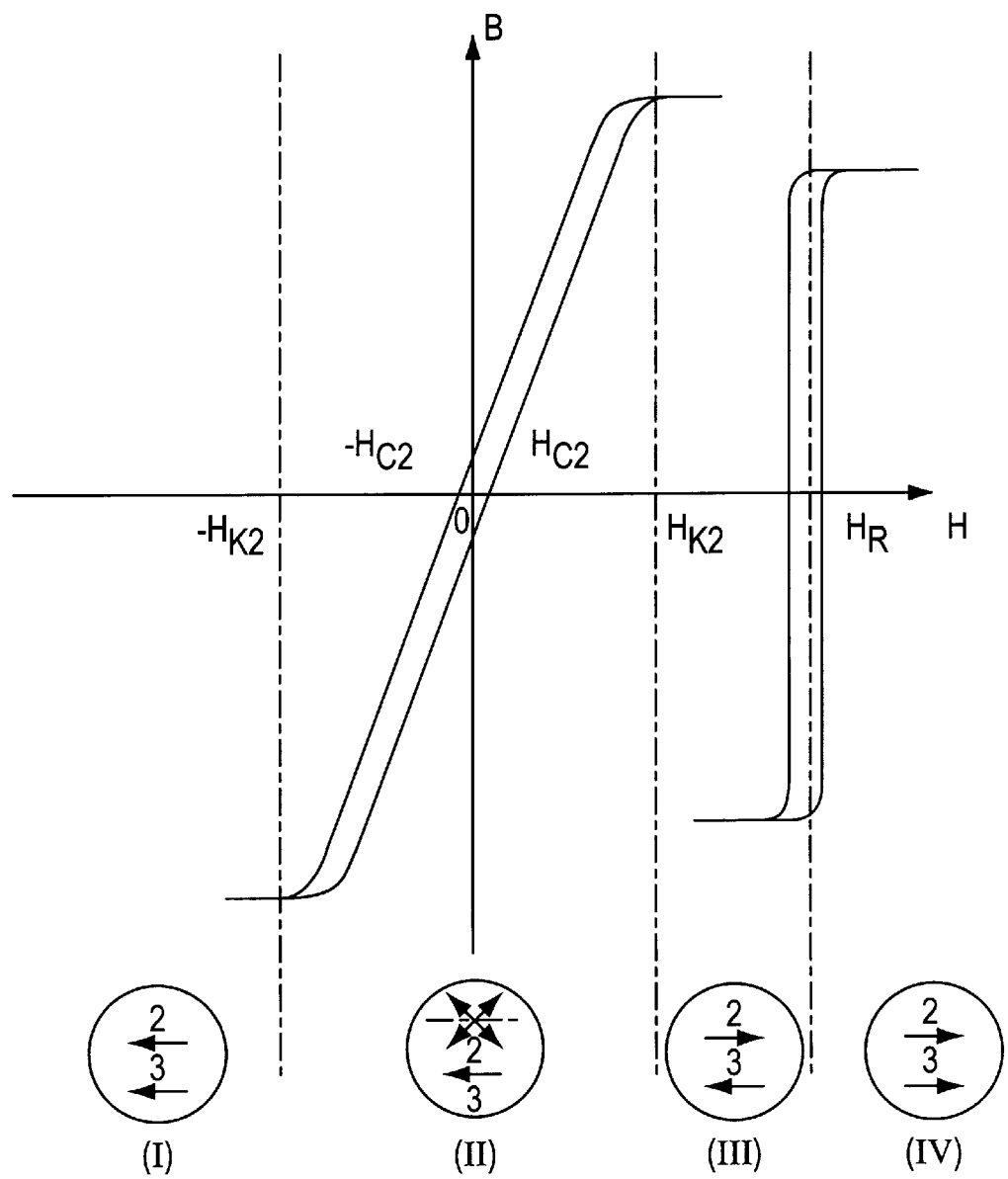
FIG. 1 is a B-H curve explaining the principle of operation of a magnetoresistance effect film according to the present invention.

As is shown in FIG. 1, the antimagnetic force of the one ferromagnetic thin film exchange-biased by the adjacent antiferromagnetic thin film is represented by Hr, the coercive force of the other ferromagnetic thin film by $Hc_2$, and the anisotropic magnetic field by $Hk_2$ ($0<Hk_2<Hr$). First, an external field H is applied at such an intensity as satisfying $H<-Hk_2$ (I). At this time, the directions of magnetization of the ferromagnetic thin films 2,3 are negative (−) like H. When the external magnetic field is then progressively reduced, the magnetization of the ferromagnetic thin film 2 is rotated in a positive (+) direction in $-Hk_2<H<Hk_2$ (II), and the directions of magnetization of the ferromagnetic thin films 2,3 become opposite to each other in the range (III) of $Hk_2<H<Hr$. In the range (IV) of $Hr<H$ where the external magnetic field has been intensified further, the magnetization of the ferromagnetic thin film 3 is also reversed so that the directions of magnetization of the ferromagnetic thin films 2 and 3 are both positive (+).

Figure 2:
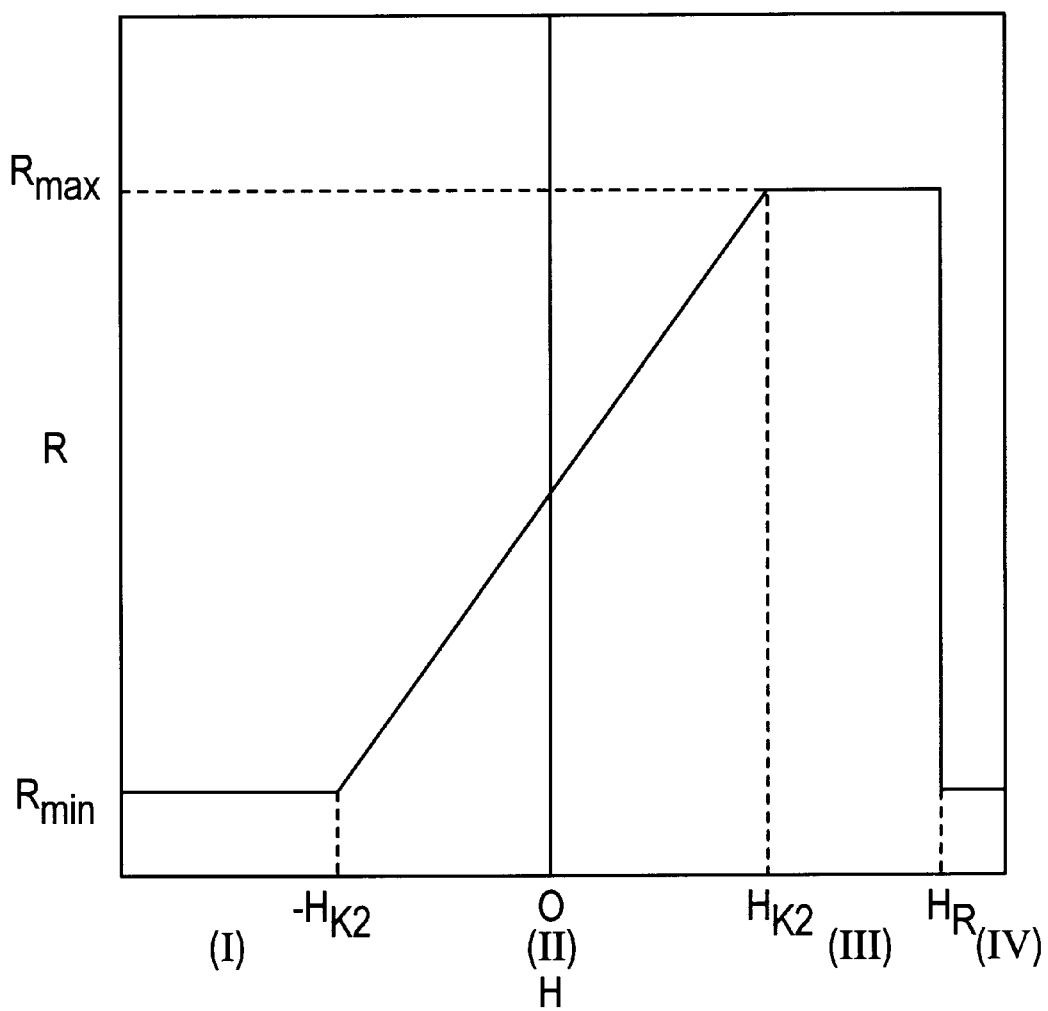
FIG. 2 is an R-H curve explaining the principle of operation of the magnetoresistance effect film according to the present invention.

As is shown in FIG. 2, the resistance of the above film changes depending on the relative directions of magnetization of the ferromagnetic thin films 2 and 3, linearly changes around the zero magnetic field, and takes a maximum value (Rmax) in the range (III).

The antiferromagnetic material employed for the antiferromagnetic thin film 5 in the present invention specifically has a superlattice structure 5a, 5b, . . . , 5n, 5n+1 in which at least two oxide antiferromagnetic materials 5a, 5b selected from NiO, $Ni_xCo_{1-x}O$ and CoO are alternately stacked, in which x stands for a positive value of 0.1 to 0.9. The film thickness ratio of the individual layers in such a superlattice can be set so that the volume molar ratio of nickel to cobalt in the superlattice falls within a range of 1 to 6. This makes the superlattice act as an antiferromagnetic material at 100° C. and higher.

The upper limit of the film thickness of the antiferromagnetic thin film is 1,000 Å. Although no particular lower limit is imposed on the thickness of the antiferromagnetic thin film, it is preferred to set the lower limit at 100 Å or greater for better crystallinity because the crystallinity of the superlattice of the antiferromagnetic material significantly affects the intensity of the exchange-coupling magnetic field which is applied to the adjacent ferromagnetic thin film. Further, it is preferred to limit the unit film thickness of each antiferromagnetic layer forming the antiferromagnetic superlattice to 50 Å or smaller. Inside the above ranges, interactions at interfaces between the individual antiferromagnetic layers are significantly reflected to characteristics of the superlattice. This makes it possible to apply a large biasing magnetic field to the adjacent ferromagnetic thin film. In addition, formation of the films with the substrate temperature controlled to 100–300° C. results in improved crystallinity so that the biasing magnetic field is intensified. For the formation of the films, a film-forming process such as vacuum deposition, sputtering or molecular beam epitaxy (MBE) is preferred. Preferred as the material of the substrate is glass, Si, MgO, $Al_2O_3$, GaAs, ferrite, $CaTi_2O_3$, $BaTi_2O_3$, $Al_2O_3$—TiC or the like.

Although no particular limitation is imposed on the ferromagnetic material used for the ferromagnetic thin films in the present invention, preferred specific examples include Fe, Ni, Co, Mn, Cr, Dy, Er, Nd, Tb, Tm, Ge and Gd. As alloys and compounds containing these elements, preferred examples include Fe—Si, Fe—Ni, Fe—Co, Fe—Gd, Ni—Fe—Co, Ni—Fe—Mo, Fe—Al—Si (sendust), Fe—Y, Fe—Mn, Cr—Sb, Co-base amorphous alloys, Co—Pt, Fe—Al, Fe—C, Mn—Sb, Ni—Mn and ferrite.

In the present invention, the magnetic thin films are formed by selecting appropriate magnetic materials from the materials exemplified above. In particular, selection of a material for the other ferromagnetic thin film which is not located adjacent the antiferromagnetic thin film so that the anisotropic magnetic field $Hk_2$ is greater than its coercive force $Hc_2$ realizes the construction of the magnetoresistance effect thin film according to the present invention.

Further, the anisotropic magnetic field can be increased by making the film thickness smaller. For example, the anisotropic magnetic field $Hk_2$ can be made greater than the coercive force $Hc_2$ when a ferromagnetic thin film of NiFe is formed with a thickness of 10 Å or so.

In such a magnetoresistance effect film, the easy magnetization axis of each ferromagnetic thin film is perpendicular to the direction of a signal magnetic field. The magnetoresistance effect film can be produced by forming the ferromagnetic thin films under such a magnetic field that the anisotropic magnetic field $Hk_2$ of the ferromagnetic thin films in the direction of the applied signal magnetic field satisfies the following inequality: $Hc_2<Hk_2<Hr$. Specifically, magnetic fields applied upon formation of the ferromagnetic thin films are rotated over 90 degrees or the substrate is rotated over 90 degrees in a magnetic field so that the easy magnetization axis of the one ferromagnetic film located adjacent the antiferromagnetic film and the easy magnetization axis of the other ferromagnetic film located adjacent the one ferromagnetic thin film with the non-magnetic film interposed therebetween cross at a right angle.

The upper limit of the thickness of each ferromagnetic thin film is preferably 200 Å. A film thickness greater than 200 Å is wasting upon formation of the film and uneconomical, because the change in the magnetic resistance of the magnetoresistance effect film does not increase as the film thickness becomes greater. Although no particular lower limitation is imposed on the thickness of the ferromagnetic thin film, a film thickness smaller than 30 Å results in greater surface scattering effect of conduction electrons so that the change in magnetic resistance becomes smaller. On the other hand, a film thickness of 30 Å or greater makes it easier to maintain the film thickness uniform and also leads to better characteristics. It is also possible to prevent the saturation magnetization from becoming unduly small.

The coercive force of the one ferromagnetic thin film located adjacent the antiferromagnetic thin film can be reduced by forming it in continuation with the antiferromagnetic thin film while maintaining the temperature of the substrate at 100–300° C.

Further, formation of a Co or Co-base alloy layer 8 at the interface between each ferromagnetic thin film 2, 3 and the non-magnetic thin film 1 increases the probability of interfacial scattering of conduction electrons so that a still greater change in magnetic resistance can be obtained. The lower limit of the film thickness of the Co or Co-base alloy layer 8 is 5 Å. A smaller film thickness reduces the effect of the interposition of the film and further, makes it difficult to control the film thickness. Although no particular upper limitation is imposed on the thickness of the interposed film, about 30 Å or so are preferred. A thickness greater than this level results in appearance of a hysteresis in outputs in an operation range of the magnetoresistance effect device.

By arranging an additional antiferromagnetic thin film or a permanent magnet thin film in adjacent to and in the direction of easy magnetization of the ferromagnetic thin film for detecting an external magnetic field, that is, the other ferromagnetic thin film which is not located adjacent the antiferromagnetic layer in the above magnetoresistance effect film, the magnetic domains can be stabilized so that non-linear outputs such as Barkhausen jumps can be avoided. As the material of the additional antiferromagnetic thin film employed for the stabilization of the magnetic domains, FeMn, NiMn, NiO, CoO, FeO, $Fe_2O_3$, CrO, MnO or the like is preferred. On the other hand, as the material of the permanent magnet thin film, CoCr, CoCrTa, CoCrTaPt, CoCrPt, CoNiPt, CoNiCr, CoCrPtSi, FeCoCr or the like is preferred. Further, Cr or the like can be used as a primer for the permanent magnet thin film.

The non-magnetic thin film serves to reduce the magnetic interaction between the ferromagnetic thin films. No particular limitation is imposed on its material. A suitable material can be selected from various metallic materials, semimetallic nonmagnetic materials and non-metallic non-magnetic materials.

Preferred examples of metallic non-magnetic materials include Au, Ag, Cu, Pt, Al, Mg, Mo, Zn, Nb, Ta, V, Hf, Sb, Zr, Ga, Ti, Sn and Pb and alloys thereof. Preferred examples of semimetallic non-magnetic materials include $SiO_2$, SiO, SiN, $Al_2O_3$, ZnO, MgO and TiN and those obtained by one or more elements to such materials.

From experimental results, the desired thickness of the non-magnetic thin film is 20 to 35 Å. A film thickness greater than 40 Å generally results in concentration of a current at the non-magnetic thin film so that the spin-dependent electron-scattering effect relatively becomes smaller. This results in a reduction in the rate of change in the magnetoresistance. On the other hand, a film thickness smaller than 20 Å results in unduly large magnetic interaction between the ferromagnetic thin films and unavoidably leads to occurrence of a magnetically direct contact state (pin-holes). Accordingly, it becomes difficult to produce a difference in the direction of magnetization between both the ferromagnetic thin films.

The thicknesses of the magnetic and non-magnetic thin films can be measured by a transmission electron microscope, a scanning electron microscope, an Auger electron spectroscopic analyzer or the like. Further, the crystalline structure of each thin film can be ascertained by X-ray diffraction, fast electron-beam diffraction or the like.

In the magnetoresistance effect device according to the present invention, no particular limitation is imposed on the number N of repeated stacking of artificial lattice films. This number can be chosen as desired depending on the target rate of change in magnetoresistance. However, the antiferromagnetic thin film has a large resistivity and impairs the effect of the stacking. It is therefore preferred to have the structure of antiferromagnetic layer/ferromagnetic layer/non-magnetic layer/ferromagnetic layer/non-magnetic layer/ferromagnetic layer/antiferromagnetic layer.

Further, it is also possible to arrange an anti-oxidizing film such as a silicon nitride, silicon oxide or aluminum oxide film over the surface of the uppermost layer, that is, the ferromagnetic thin film. In addition, metallic conductive layers can also be provided lead out electrodes.

As magnetic characteristics of ferromagnetic thin films contained in a magnetoresistance effect device cannot be measured directly, they are usually measured as will be described below. Namely, ferromagnetic thin films are alternately formed with non-magnetic thin films until the total thickness of the ferromagnetic thin films reaches 500–1,000 Å or so to prepare a sample for the measurement, and magnetic characteristics are measured with respect to the sample. In this case, the thickness of each ferromagnetic thin film, the thickness of the non-magnetic thin film and the composition of the non-magnetic thin film are the same as those of the magnetoresistance effect device.

Figure 4A:
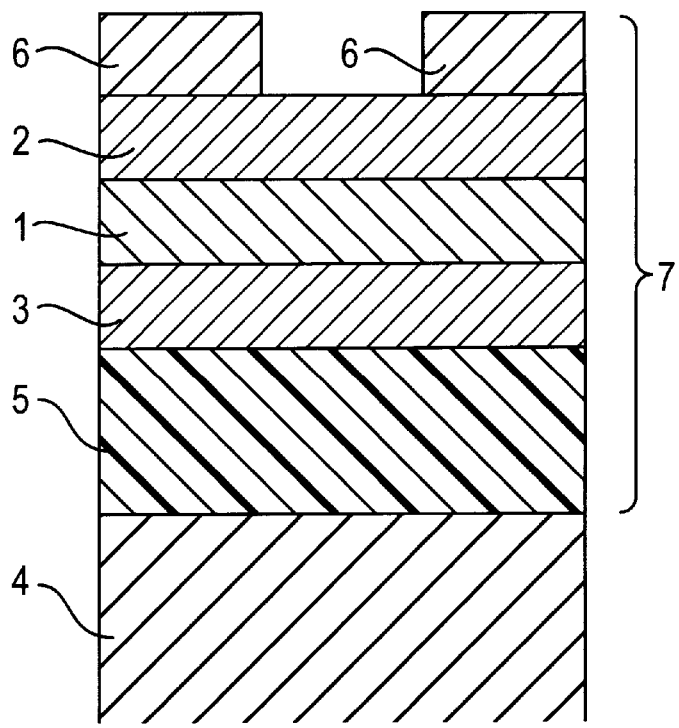
FIG. 4A is a cross-sectional view of a magnetoresistance effect film according to one embodiment of the present invention.

The magnetoresistance effect device according to the present invention will be described specifically by examples. FIG. 4A is a cross-sectional view of an artificial lattice film 7 according to one embodiment of the present invention. In FIG. 4, the artificial lattice film 7 has been constructed by successively stacking, on a glass substrate 4, an antiferromagnetic thin film 5 having a superlattice structure formed of at least two oxide anti-ferromagnetic materials, one of ferromagnetic thin films, namely, the one ferromagnetic thin film 3, a non-magnetic thin film 1, the other ferromagnetic thin film 2, and an antiferromagnetic thin film 6.

In the above-described artificial lattice film 7, the non-magnetic thin film 1 is interposed between the adjacent two ferromagnetic thin films 2,3. In addition, an additional antiferromagnetic thin film or a permanent magnet thin film can be arranged in adjacent to the ferromagnetic thin film 2.

The glass substrate 4 is placed in a film-forming apparatus, followed by evacuation to the order of $10^{-7}$ Torr. The substrate temperature was raised to 150° C. The antiferromagnetic thin film 5 was first formed to a thickness of 500 Å and the ferromagnetic thin film 3 was then formed with NiFe, whereby an exchange-coupling film was formed. The temperature of the substrate was allowed to cool down to room temperature, and the non-magnetic thin film 1 and the other ferromagnetic thin layer 2 were formed to obtain a magnetoresistance effect film.

Figure 4B:
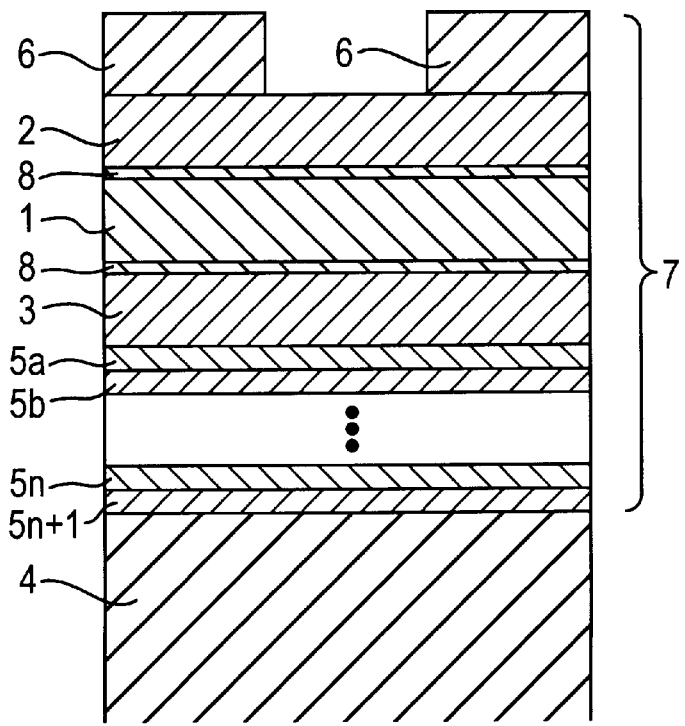
FIG. 4B is a cross-sectional view of a magnetoresistive effect film according to another embodiment of the present invention.

The artificial lattice film 7 was formed at a film-forming speed of about 2.2 to 3.5 Å/sec. As shown in FIG. 4B, an alloy layer 8 is interposed between each ferromagnetic thin film 2, 3 and the non-magnetic thin film 1.

Incidentally, when indicated, for example, as $(CoO(10)/NiO(10))_{25}/NiFe(100)/Cu(25)/NiFe(100)$, it is meant that a superlattice $5a, 5b \ldots, 5n, 5n+1$ was formed by alternately stacking CoO and NiO thin films 10 Å by 10 Å 25 times on a substrate and an Ni80%—Fe20% alloy thin film of 100 Å, a Cu thin film of 25 Å, and an Ni80%—Fe20% thin film of 100 Å were then successively formed.

Measurement of magnetization was conducted by a vibrating sample magnetometer. For the measurement of resistance, a sample in a shape of 1.0×10 mm² was prepared from the sample, and the resistance was measured by the 4 terminal method when the external magnetic field was changed from −500 to 500 Oe while applying an external magnetic field in the plane in a direction perpendicular to a current. From the resistances so measured, the rate of change in the magnetic resistance, ΔR/R, was calculated. The rate of change in resistance ΔR/R was calculated in accordance with the following formula:

$$\frac{\Delta R}{R} = \frac{Rmax - Rmin}{Rmin} \times 100(\%) \quad (1)$$

Where,

Rmax: maximum resistance, and

Rmin: minimum resistance.

EXAMPLES 1–4

The constructions of the thus-produced magnetoresistance effect films are shown in the following table.

| | |
|---|---|
| Example 1 | Glass/(CoO(10)/NiO(10))$_{25}$/NiFe(100)/Cu(25)/NiFe(100) |
| Example 2 | Glass/(CoO(8)/NiO(12))$_{25}$/NiFe(100)/Cu(25)/NiFe(100) |
| Example 3 | Glass/(CoO(5)/NiO(15))$_{25}$/NiFe(100)/Cu(25)/NiFe(100) |
| Example 4 | Glass/(CoO(3)/NiO(18))$_{25}$/NiFe(100)/Cu(25)/NiFe(100) |

Figure 5:
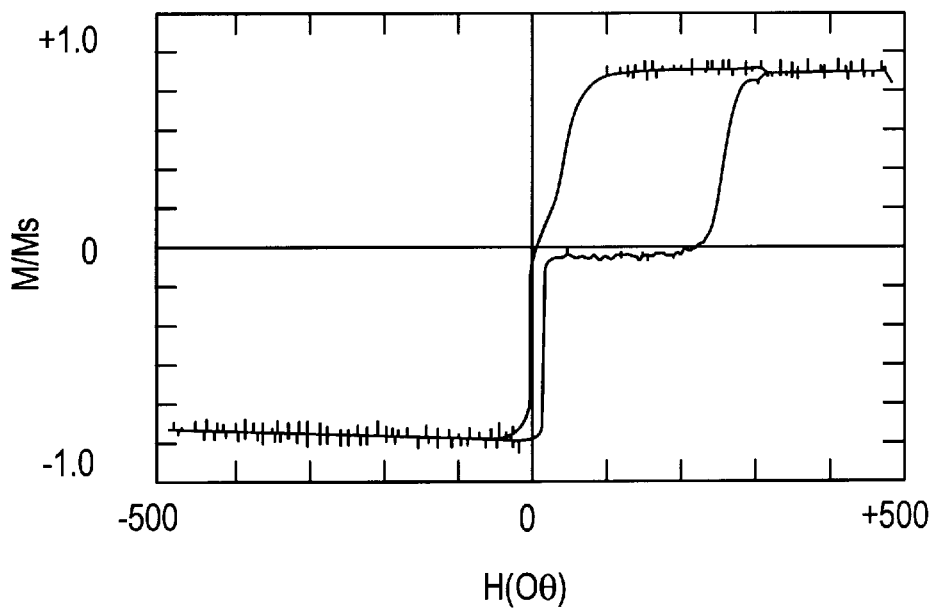
FIG. 5 is a B-H curve of the magnetoresistance effect film according to the present invention.
Figure 6:
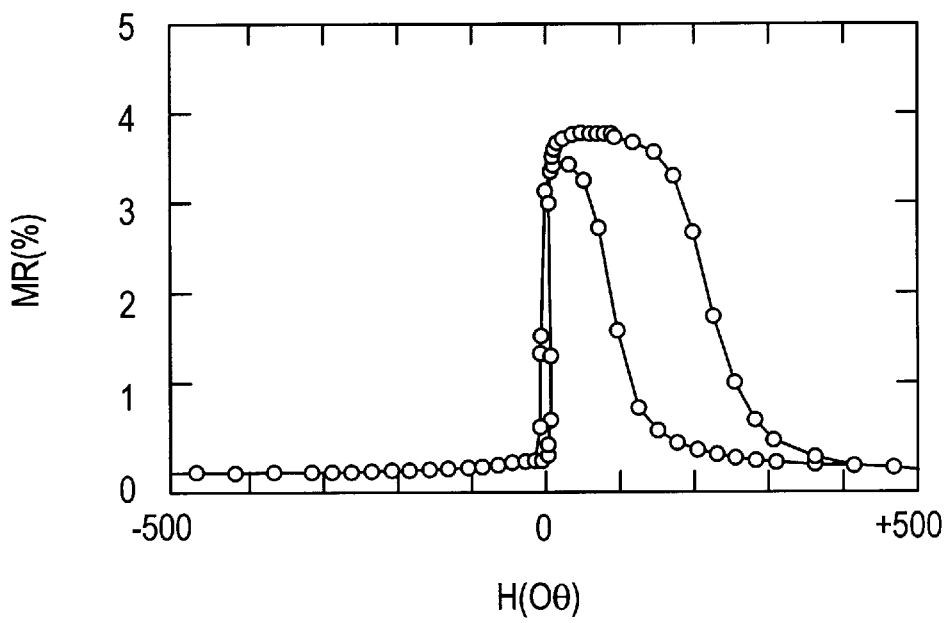
FIG. 6 is an MR curve of the magnetoresistance effect film according to the present invention.
Figure 7:
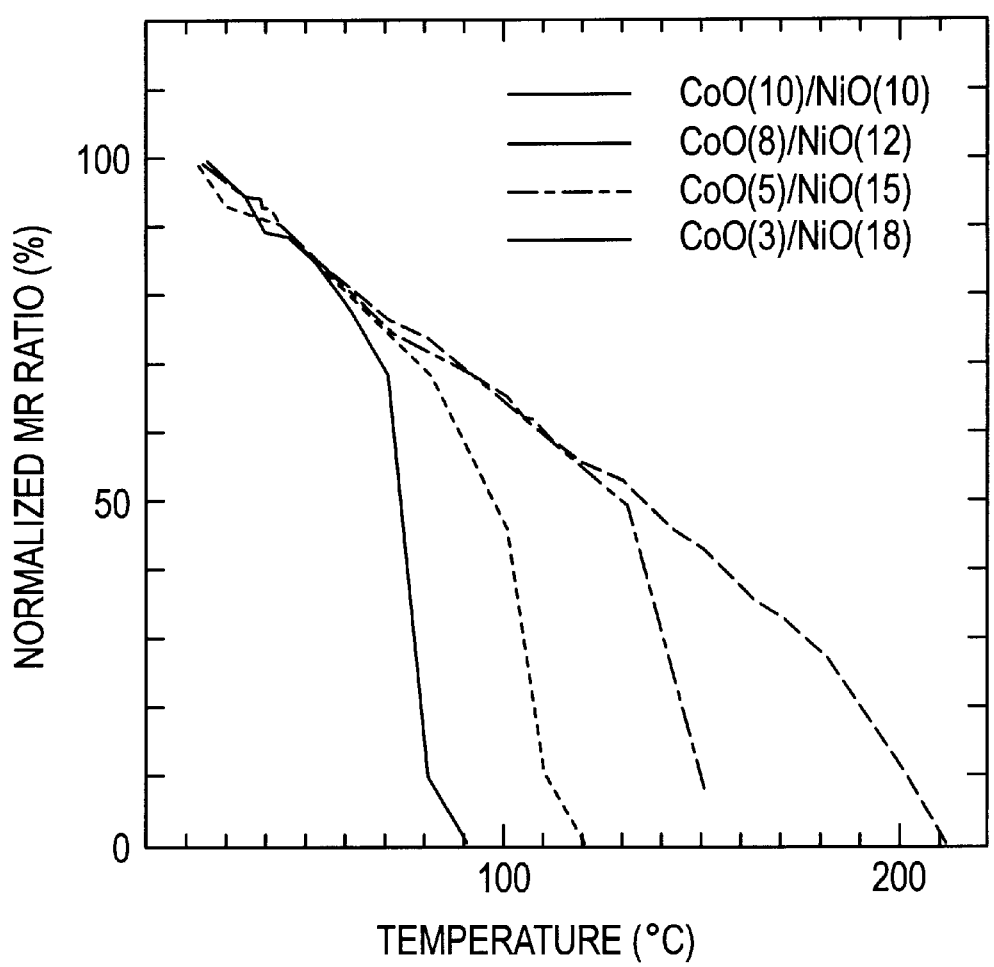
FIG. 7 diagrammatically shows temperature characteristics of the rate of change in resistance of the magnetoresistance effect film according to the present invention.

By setting the thickness of the non-magnetic thin film at 25 Å, a rate of change in resistivity of 3.8% or so was obtained. By interposing Co at an interface between the ferromagnetic thin film (NiFe) and the non-magnetic thin film (Cu), a rate of change in resistivity of 6% was obtained. A B-H curve and M-R curve of the artificial lattice film (No. 1) are shown in FIGS. 5 and 6, respectively. Further, it is understood that a magnetoresistance effect device operable at still higher temperatures can be obtained by setting the film thickness ratio of NiO to CoO in an antiferromagnetic thin film at 1.5 (No. 2), 3 (No. 3) or 6 (No. 4) as shown in FIG. 7.

In the above-described embodiments, the superlattice of CoO and NiO was used as the antiferromagnetic thin film 5. With magnetoresistance effect devices obtained by substituting a superlattice of $Ni_xCo_{1-x}O$ and NiO, a superlattice of $Ni_xCo_{1-x}O$ and CoO and a superlattice of $Ni_xCo_{1-x}O$, NiO and CoO, respectively, rates of change in resistance in a range of 4% to 7% were also obtained.

The film formation was conducted in such a state that NdFeB magnets were arranged on opposite sides of a glass substrate and an external magnetic field of approximately 400 Oe was applied in parallel with the glass substrate. Measurement of a B-H curve of the resultant sample indicated that the direction in which the magnetic field was applied during the film formation became an easy magnetization axis of an artificial lattice, that is, a NiFe layer.

What is claimed is:

1. A process for producing a magnetoresistance effect film by forming, on a substrate, at least two ferromagnetic thin films stacked one over with a non-magnetic thin film interposed therebetween, and an antiferromagnetic thin film arranged in adjacent to one of said ferromagnetic thin films, said antiferromagnetic thin film being a superlattice formed of at least two oxide antiferromagnetic materials selected from NiO, $Ni_xCo_{1-x}O$ (0.1≦x≦0.9) and $C_oO$, and a biasing magnetic field Hr applied to said one ferromagnetic thin film located adjacent said antiferromagnetic thin film being greater than coercive magnetic force $Hc_2$ of the other ferromagnetic thin film, wherein a magnetic field applied during formation of said one ferromagnetic thin film and a magnetic field applied during formation of said other ferromagnetic thin film are rotated over 90 degrees from each other so that easy magnetization axes of said ferromagnetic thin films are perpendicular to each other.

2. A process according to claim 1, wherein said substrate is heated to 100 to 300° C. prior to the formation of said antiferromagnetic thin film and its adjacent ferromagnetic thin film.

* * * * *